United States Patent
Ohtsuki

(10) Patent No.: US 8,653,566 B2
(45) Date of Patent: Feb. 18, 2014

(54) SOLID-STATE IMAGING DEVICE

(75) Inventor: Hirohisa Ohtsuki, Toyama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/611,953

(22) Filed: Sep. 12, 2012

(65) Prior Publication Data

US 2013/0001650 A1 Jan. 3, 2013

Related U.S. Application Data

(63) Continuation of application No. PCT/JP2010/007267, filed on Dec. 15, 2010.

(30) Foreign Application Priority Data

Mar. 23, 2010 (JP) ................................. 2010-066800

(51) Int. Cl.
*H01L 27/148* (2006.01)

(52) U.S. Cl.
USPC ........... 257/233; 257/225; 257/229; 257/231; 257/234

(58) Field of Classification Search
USPC .......................................... 257/225, 229–234
See application file for complete search history.

(56) References Cited

U.S. PATENT DOCUMENTS

| | | | | |
|---|---|---|---|---|
| 5,780,884 A * | 7/1998 | Kumagai et al. | ............... | 257/236 |
| 5,998,818 A * | 12/1999 | Kumagai et al. | ............... | 257/291 |
| 6,838,715 B1 * | 1/2005 | Bencuya et al. | ............... | 257/291 |
| 6,898,109 B2 * | 5/2005 | Hirose et al. | ................... | 365/149 |
| 7,002,866 B2 * | 2/2006 | Hirose et al. | ................... | 365/207 |
| 7,042,030 B2 * | 5/2006 | Balasuramanian et al. | .. | 257/211 |
| 7,800,191 B2 * | 9/2010 | Ohtsuki et al. | ................. | 257/432 |
| 7,847,848 B2 * | 12/2010 | Ohtsuki et al. | ................. | 348/308 |
| 7,906,827 B2 * | 3/2011 | Katsuno et al. | ............... | 257/448 |
| 8,068,158 B2 * | 11/2011 | Ohtsuki | ......................... | 348/308 |
| 8,111,311 B2 * | 2/2012 | Iwane | ........................... | 348/294 |
| 8,134,625 B2 * | 3/2012 | Abe et al. | ...................... | 348/308 |
| 8,139,133 B2 * | 3/2012 | Iwane et al. | ................... | 348/308 |
| 8,350,300 B2 * | 1/2013 | Aoki | .............................. | 257/222 |
| 2003/0095429 A1 * | 5/2003 | Hirose et al. | ................... | 365/149 |
| 2004/0212008 A1 * | 10/2004 | Hasegawa | ...................... | 257/316 |
| 2005/0111250 A1 * | 5/2005 | Balasuramanian et al. | .. | 365/148 |

(Continued)

FOREIGN PATENT DOCUMENTS

| | | | |
|---|---|---|---|
| JP | 03-238856 A | | 10/1991 |
| JP | 06069210 A | * | 3/1994 |

(Continued)

OTHER PUBLICATIONS

International Search Report mailed Mar. 22, 2011 issued in corresponding International Application No. PCT/JP2010/007267.

*Primary Examiner* — Fernando L Toledo
*Assistant Examiner* — Christine C Lau
(74) *Attorney, Agent, or Firm* — McDermott Will & Emery LLP

(57) ABSTRACT

The present invention provides a solid-state imaging device in which high S/N is achieved. A solid-state imaging device includes a photodiode, a transfer transistor, a floating diffusion, a floating diffusion wiring, an amplifying transistor, a power line, and first output signal lines, in which the first output signal lines are formed one on each side of the floating diffusion wiring in a layer having the floating diffusion wiring formed on a semiconductor substrate, and the power line is formed above the floating diffusion wiring.

5 Claims, 10 Drawing Sheets

(56) References Cited

U.S. PATENT DOCUMENTS

| | | | |
|---|---|---|---|
| 2005/0168618 A1* | 8/2005 | Okita et al. | 348/335 |
| 2006/0022201 A1* | 2/2006 | Kim et al. | 257/72 |
| 2006/0050586 A1* | 3/2006 | Ohtsuki et al. | 365/210 |
| 2006/0273353 A1 | 12/2006 | Guidash et al. | |
| 2007/0210398 A1* | 9/2007 | Ohtsuki et al. | 257/431 |
| 2008/0029787 A1* | 2/2008 | Watanabe et al. | 257/233 |
| 2009/0026563 A1* | 1/2009 | Katsuno et al. | 257/432 |
| 2009/0207291 A1* | 8/2009 | Abe et al. | 348/308 |
| 2009/0290057 A1* | 11/2009 | Ohtsuki | 348/303 |
| 2009/0295979 A1* | 12/2009 | Matsuo et al. | 348/335 |
| 2012/0314109 A1* | 12/2012 | Murakami et al. | 348/300 |

FOREIGN PATENT DOCUMENTS

| | | |
|---|---|---|
| JP | 2004-186407 A | 7/2004 |
| JP | 2007-243093 A | 9/2007 |
| JP | 2008-172108 A | 7/2008 |
| JP | 2008-177357 A | 7/2008 |
| JP | 2008-543085 A | 11/2008 |
| WO | WO-2006/130545 A2 | 12/2006 |

* cited by examiner

PRIOR ART

SOLID-STATE IMAGING DEVICE

CROSS REFERENCE TO RELATED APPLICATIONS

This is a continuation application of PCT Patent Application No. PCT/JP2010/007267 filed on Dec. 15, 2010, designating the United States of America, which is based on and claims priority of Japanese Patent Application No. 2010-066800 filed on Mar. 23, 2010. The entire disclosures of the above-identified applications, including the specifications, drawings and claims are incorporated herein by reference in their entirety.

FIELD

The present invention relates to a solid-state imaging device.

BACKGROUND

A metal oxide semiconductor (MOS) solid-state imaging device used as an imaging device such as a digital still camera includes a sensor in which multiple pixel cells are arranged two-dimensionally (e.g., arranged in an array). If data can be amplified near the sensor when read out from the sensor, it is possible to read out high S/N data. If the high S/N data can be read out, it is possible to obtain the added value that clear image with less noise can be achieved.

Moreover, as the size of pixel cells has been reduced in recent years following the increase in the number of pixels in an image sensor, the amount of signals which can be generated in the pixel cells has been decreasing. Therefore, improving S/N is strongly demanded. With these backgrounds, various proposals have been made to realize high S/N (e.g., see Patent Literature 1).

CITATION LIST

Patent Literature

[PTL 1] Japanese Unexamined Patent Application Publication No. 2004-186407

SUMMARY

Technical Problem

A solid-state imaging device according to the related art which is recited in Patent Literature 1 is, for example, a MOS solid-state imaging device 1100 as shown in FIG. 7 and includes a pixel array 1101 that converts optical signals to electrical signals, a vertical scanning circuit 1102 that selects the pixel array 1101 in the row direction, and a readout circuit 1103 that reads out signals in the column direction from the pixel array 1101.

The pixel array 1101 includes pixel cells 1104 that are arranged in an array.

The pixel cells 1104 each includes a photodiode 1105 that stores electric charges by photoelectric conversion according to an amount of light received, a transfer transistor 1106 that transfers the electric charges stored in the photodiode 1105 to an electric charge storage (FD) according to a transfer control signal TX, an amplifying transistor 1107 that outputs signals in an output line (OUT) 1109 according to a level of the electric charge storage (FD), and a reset transistor 1108 that initializes the electric charge storage (FD) according to a reset signal RES. The drains of the reset transistor 1108 and the amplifying transistor 1107 are connected to a pixel select line (VDD).

Moreover, FIG. 8 is a layout view of a configuration of the pixel cell 1104.

The drain of the transfer transistor 1106 and the gate of the amplifying transistor 1107 are connected to an electric charge storage (FD) 1110 and a FD wiring 1111, and the drains of the amplifying transistor 1107 and the reset transistor 1108 are connected to a pixel select line (VDD) 1112.

A brief description of the operations of the MOS solid-state imaging device 1100 in which the pixel array is provided as above will be given with reference to the timing chart shown in FIG. 9.

As shown in FIG. 9, the pixel select line (VDD) 1112 is in OFF state at t=t0, which is the initial state. At this time, the electric charge storage (FD) 1110 of the pixel cell is at LOW level and the amplifying transistor 1107 is in OFF state. First, at t=t1, the pixel select line (VDD) 1112 is brought to ON state, i.e., the signal level of the pixel select line (VDD) 1112 is set to be High level. Next, during t=t2 to t3, the reset signal RES of the row to read out is put in ON state, i.e., set to be High level. Thus, the signal level of the electric charge storage (FD) 1110 is reset to be High level. Next, at t=t4, the transfer control signal TX is put in ON state, i.e., set to be High level so that the electric charges stored in the photodiode 1105 by photoelectric conversion is transferred to the electric charge storage (FD) 1110. As shown in t=t4 to t5 in FIG. 9, the electric potential level of the electric charge storage (FD) 1110 changes (decreases). The amplifying transistor 1107 amplifies the changes and the amplified changes are output in the output line (OUT) 1109.

However, due to the large wiring parasitic capacitance between the electric charge storage (FD) 1110 and the FD wiring 1111 in the solid-state imaging device of the related art, the signal amplitude decreases, thereby leading to a problem that S/N deteriorates. The mechanism will be described below.

When transferring the electric charges stored in the photodiode 1105 to the FD wiring 1111, a MOS image sensor generates a voltage V according to electric charges Q and the voltage V is transmitted to the amplifying transistor 1107. Here, a transformation is expressed as $V=Q/Cfd$ using a parasitic capacitance Cfd of the FD wiring 1111.

It is understood from this transformation that the larger the value of parasitic capacitance Cfd of the FD wiring 1111, the smaller the voltage transmitted to the amplifying transistor 1107.

Here, the parasitic capacitance Cfd of the FD wiring 1111 will be described.

FIG. 10 is a cross-sectional schematic view taken along the line C-C' of the solid-state imaging device 1100 of the related art, illustrating the positional relationship between the output line (OUT) 1109, the electric charge storage (FD) 1111, and the pixel select line (VDD) 1112. The parasitic capacitance Cfd of the FD wiring 1111 includes the diffusion capacitance of the transfer transistor 1106, the gate capacitance of the amplifying transistor 1107, and parasitic capacitances such as an inter-wiring capacitance.

With regard to the inter-wiring capacitance, the parasitic capacitance Cfd of the FD wiring 1111 is roughly divided into the capacitance C111 and the fringe capacitance C112, the capacitance C111 occurring between the FD wiring 1111 and the output line (OUT) 1109 provided side by side thereto, and the fringe capacitance C112 occurring between the FD wiring 1111 and the pixel select line (VDD) 1112.

Here, since the output line (OUT) 1109 performs operations following the operations of the FD wiring 1111, the capacitance C111 which occurs between the FD wiring 1111 and the output line (OUT) 1109 is hardly seen.

However, the fringe capacitance C112 between the FD wiring 1111 and the pixel select line (VDD) 1112 has a large capacitance value. Although a wiring width is narrow (e.g., 100 nm) to provide more devices for the same substrate especially in the process in recent years, a wiring is greater in height than in width (e.g., 200 nm) to lower wiring resistance and thus the effect is large.

Thus, as the fringe capacitance C112 increases, the parasitic capacitance Cfd of the FD wiring 1111 also increases. As a result, signal amplitude at the FD wiring 1111 decreases, thereby leading to a problem that S/N deteriorates.

The present invention has been made to solve the above problems and an object of the present invention is to provide a solid-state imaging device in which high S/N is achieved.

Solution to Problem

To solve the above problems, a solid-state imaging device according to an embodiment of the present invention includes a photodiode that is formed in a semiconductor substrate and stores electric charges according to an amount of light received; a transfer transistor that reads out the electric charges from the photodiode; a floating diffusion to which the electric charges read out by the transfer transistor is transferred; a floating diffusion wiring connected to the floating diffusion; an amplifying transistor having a gate connected to the floating diffusion wiring; a power line connected to one of a drain and a source of the amplifying transistor; and a first output signal line connected to the other of the drain and the source of the amplifying transistor, in which the first output signal line includes a first wiring, a second wiring, and a third wiring in a layer having the floating diffusion wiring formed on the semiconductor substrate, the first wiring and the second wiring being formed on the separate sides of the floating diffusion wiring, and the third wiring connecting the first wiring and the second wiring, and the power line is formed above the floating diffusion wiring.

According to this configuration, the first wiring and the second wiring of a first output signal line are provided side by side with a floating diffusion wiring, and a power line is provided above the floating diffusion wiring. Therefore, the potential difference between the floating diffusion wiring, the first output signal line, and the power line is small, allowing the parasitic capacitance for the floating diffusion wiring to be relatively decreased. Therefore, S/N can be improved.

Here, the first output signal line may further include a fourth wiring that connects the first wiring and the second wiring, and the floating diffusion wiring may be surrounded by the first wiring, the second wiring, the third wiring, and the fourth wiring.

According to this configuration, since the first output signal line has the first, second, third, and fourth wirings that surround the four sides of the floating diffusion wiring, it is possible to decrease the parasitic capacitance which occurs between the floating diffusion wiring and another wiring, and improve S/N.

Here, the first output signal line may be connected to the second output signal line formed between the floating diffusion wiring and the power line.

According to this configuration, a second output signal line connected to the first output signal line is formed above the floating diffusion wiring and the electric potential of the second output signal line varies with changes in the electric potential of the first output signal line. Therefore, the parasitic capacitance which occurs between the floating diffusion wiring and the first output signal line is smaller than when the first output signal line is not connected to the second output signal line. Therefore, since signal amplitude at the floating diffusion can be increased, the signal amplitude is less likely to be affected by noise, thus allowing S/N to be improved.

Here, the floating diffusion wiring may be longer in height than in width.

According to this configuration, the parasitic capacitance between the floating diffusion wiring and the first output signal line is larger than the parasitic capacitance between the floating diffusion wiring and the power line. Therefore, it is possible to suppress the occurrence of the parasitic capacitance between the floating diffusion wiring and a wiring other than the first output signal wiring, and improve S/N.

Here, a distance between the floating diffusion wiring and the first output signal line may be longer than a distance between the floating diffusion wiring and the power line.

According to this configuration, since the floating diffusion wiring does not have parasitic capacitance with other output signal lines that do not follow the operations of the floating diffusion wiring, S/N can be improved.

Advantageous Effects

According to the present invention, it is possible to provide a solid-state imaging device in which high S/N is achieved.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Embodiments of the present invention will be described below. It should be noted that although the present invention will be described with reference to the following embodiments and attached drawings, the present invention is not intended to be limited to these embodiments and drawings.

Embodiment 1

A solid-state imaging device according to the first embodiment includes a photodiode that is formed in a semiconductor substrate and stores electric charges according to an amount of light received; a transfer transistor that reads out the electric charges from the photodiode; a floating diffusion to which the electric charges read out by the transfer transistor is transferred; a floating diffusion wiring connected to the floating diffusion; an amplifying transistor having a gate connected to the floating diffusion wiring; a power line connected to one of a drain and a source of the amplifying transistor; and a first output signal line connected to the other of the drain and the source of the amplifying transistor, in which the first output signal line includes a first wiring, a second wiring, and a third wiring in a layer having the floating diffusion wiring formed on the semiconductor substrate, the first wiring and the second wiring being formed on the separate sides of the floating diffusion wiring, and the third wiring connecting the first wiring and the second wiring, and the power line is formed above the floating diffusion wiring. Such a configuration can provide a solid-state imaging device in which high S/N is achieved.

Figure 1:
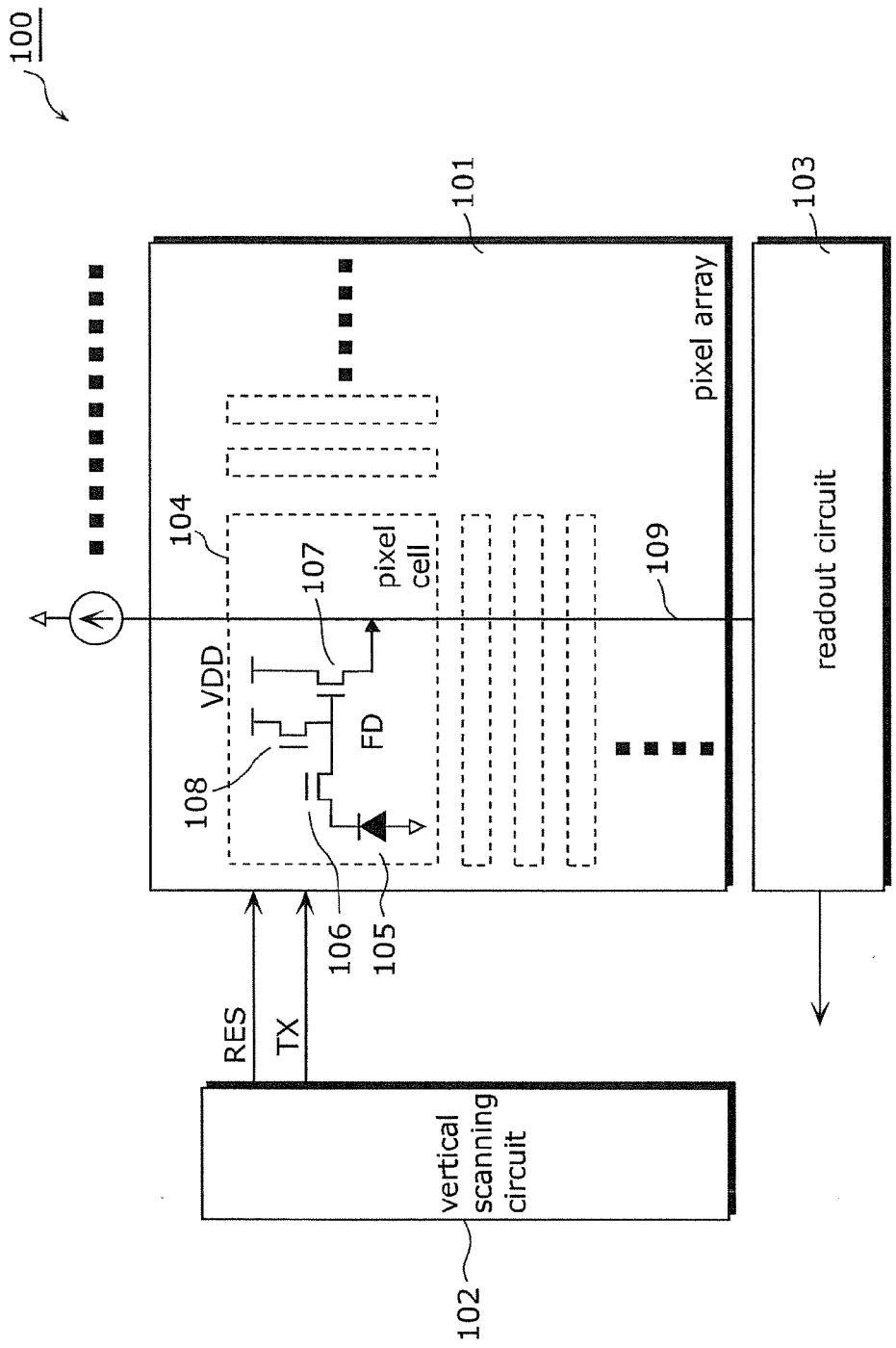
FIG. 1 is a block schematic diagram of a solid-state imaging device according to the first embodiment.
Figure 2:
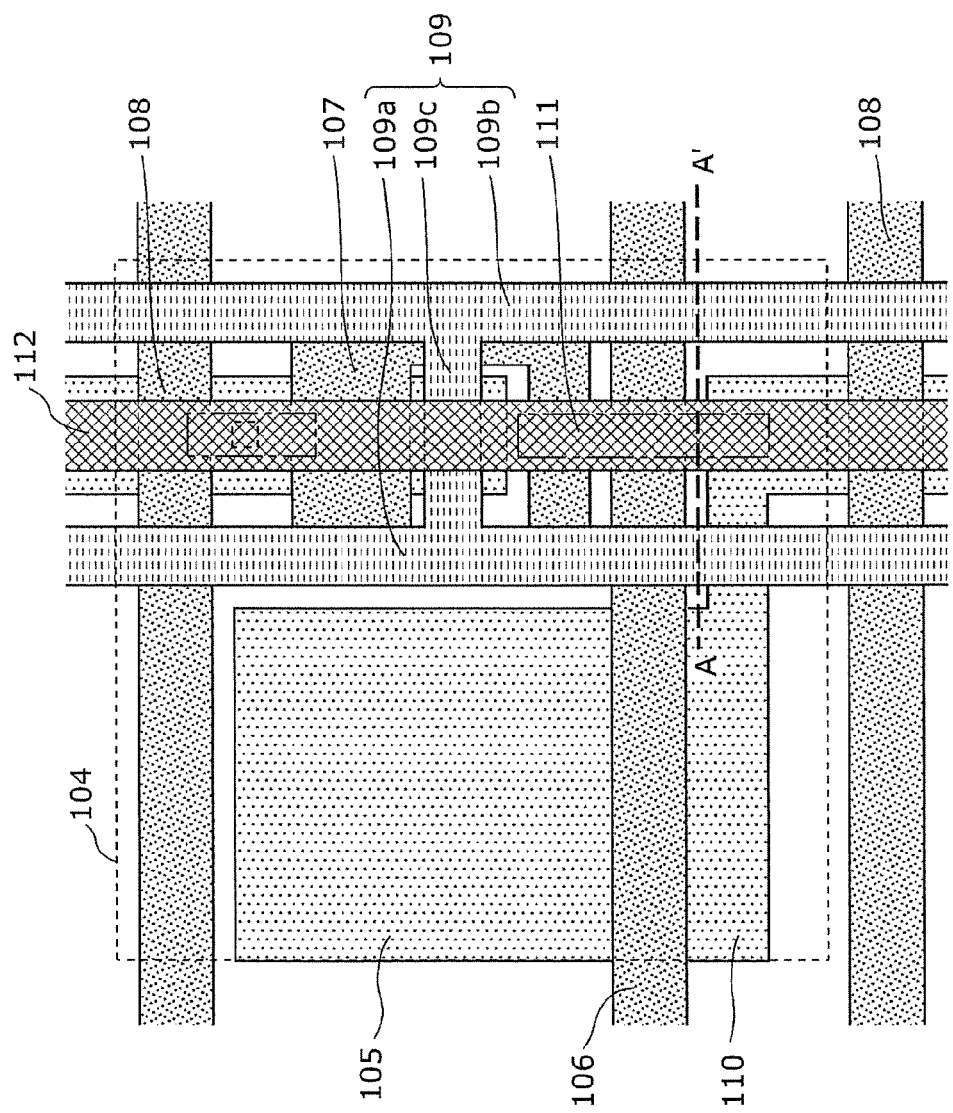
FIG. 2 is a layout view illustrating a configuration of a pixel cell of the solid-state imaging device shown in FIG. 1.
Figure 3:
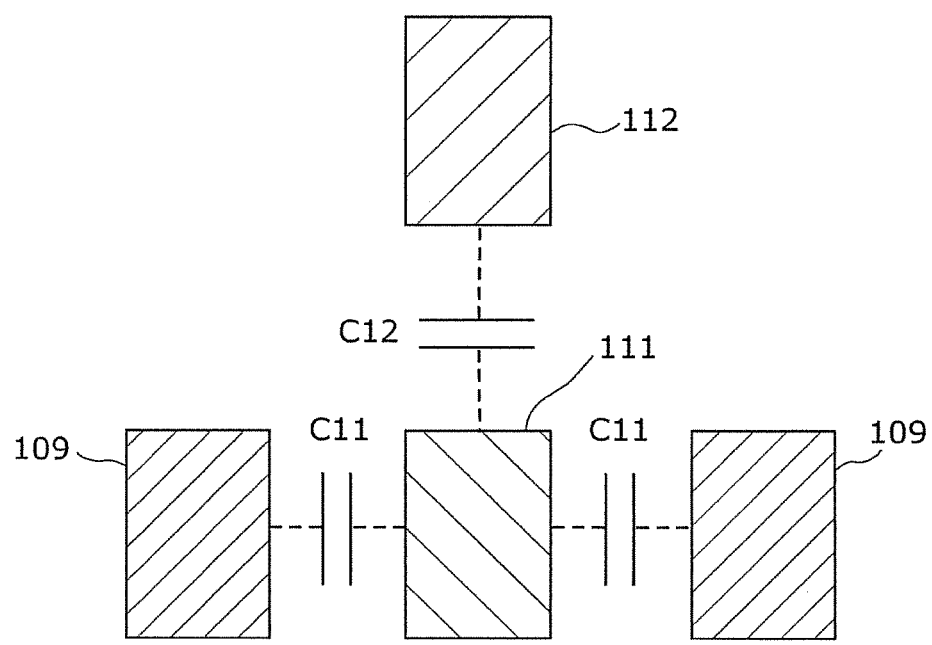
FIG. 3 is a cross-sectional schematic view taken along the line A-A' of the pixel cell shown in FIG. 2.

FIG. 1 is a block schematic diagram of a solid-state imaging device 100 according to the first embodiment of the present invention. FIG. 2 is a layout view schematically illustrating a configuration of a pixel cell 104 of the solid-state imaging device 100. Moreover, FIG. 3 is a cross-sectional schematic view taken along the line A-A' of the pixel cell 104 in FIG. 2, illustrating the positional relationships between a output line (OUT) 109 that is a wiring, a FD wiring 111, and a pixel select line (VDD) 112. The pixel cells 104 are arranged in an array (two-dimensionally) to constitute a pixel array 101. The configuration other than the layout of the pixel cells 104 is similar to the configuration of the solid-state imaging device 1100 shown in the related art.

As shown in FIG. 1, the solid-state imaging device 100 according to the first embodiment is a MOS solid-state imaging device, and includes the pixel array 101 which converts optical signals to electrical signals, a vertical scanning circuit 102 that selects the pixel array 101 in the row direction, and a readout circuit 103 that reads out signals in the column direction from the pixel array 101.

The pixel array 101 includes the pixel cells 104 which are arranged in an array.

Moreover, as shown in FIG. 2, the pixel cells 104 each includes an electric charge storage (FD) 110 having a photodiode 105 that is formed on a semiconductor substrate and stores electric charges by photoelectric conversion according to an amount of light received and a floating diffusion wiring (hereinafter referred to as a FD wiring) 111, a transfer transistor 106 that reads out and transfers electric charges stored in the photodiode 105 according to a transfer control signal TX, an amplifying transistor 107 that outputs signals in the output line (OUT) 109 according to a level of the electric charge storage (FD) 110, and a reset transistor 108 that initializes the electric charge storage (FD) 110 according to a reset signal RES. The drains of the amplifying transistor 107 and the reset transistor 108 are, for example, connected to the pixel select line (VDD) 112. Moreover, the source of the amplifying transistor 107 is connected to the output line (OUT) 109.

The electric charge storage (FD) 110 corresponds to a floating diffusion in the present invention and is connected to the FD wiring 111, and then connected to the gate of the amplifying transistor 107 via the FD wiring 111. In the solid-state imaging device 100 in the present embodiment, the FD wiring 111 and the output line (OUT) 109 are metal wirings and arranged in the same wiring layer on a semiconductor substrate. The output line (OUT) 109 includes a first wiring 109a and second wiring 109b that are formed on the separate sides of the FD wiring 111 connected to the electric charge storage (FD) 110, and a third wiring 109c that connects the first wiring 109a and the second wiring 109b.

Moreover, the pixel select line (VDD) 112 which is a power line is formed above the FD wiring 111 and composed of a metal wiring.

It should be noted that although insulating layers are omitted in FIG. 2, the insulating layers are formed between wirings, such as the output line (OUT) 109, the FD wiring 111, and the pixel select line (VDD) 112. Moreover, the insulating layers may be composed of more than three layers.

The operations of the solid-state imaging device 100 in which the pixel array is arranged as above are the same as those of a device of the related art.

Here, since an electric potential of the output line (OUT) 109 when data is read out only changes along with an amplified potential change of the FD wiring 111, a parasitic capacitance C11 which occurs between the FD wiring 111 and the output line (OUT) 10 relatively decreases. In other words, the parasitic capacitance C11 is caused by the potential difference between the output line (OUT) 109 and the FD wiring 111. However, since electric potential of the FD wiring 111 changes along with the electric potential of the output line (OUT) 109, providing the output line (OUT) 109 side by side with the FD wiring 111 can reduce the potential difference between the FD wiring 111 and the output line (OUT) 109 and relatively decrease the parasitic capacitance C11.

Moreover, in the present embodiment, the output line (OUT) 109 is provided side by side with the FD wiring 111 connected to the electric charge storage (FD) 110, and the pixel select line (VDD) 112 is provided above and side by side with the FD wiring 111. The potential change of the pixel select line (VDD) 112 is transmitted to the FD wiring 111 through the operations of the photodiode 105, the amplifying transistor 107, or other devices. The electric potential of the FD wiring 111 changes along with the potential change of the pixel select line (VDD) 112. Therefore, providing the pixel select line (VDD) 112 above and side by side with the FD wiring 111 can relatively decrease the parasitic capacitance C 12.

As a result, it is possible to decrease the parasitic capacitance which occurs between the pixel select line (VDD) 112 and the FD wiring 111. Since this can increase signal amplitude at the FD wiring 111, signal amplitude is less likely to be affected by noise and thus S/N can be improved.

Moreover, in the microfabrication in recent years, wiring height has been greater than wiring width, distance between wirings, and distance between stacked wirings. This is because in addition to advancing microfabrication, wiring resistance and via resistance need to be decreased for speeding up signal transduction. For example, in the 65 nm process generation, while the wiring width is 100 nm, the distance between wirings is 100 nm, and the distance between stacked wirings is 100 nm, the wiring height is 200 nm.

The larger the area of opposing faces of wirings opposed to each other, the larger the parasitic capacitance between the wirings. Therefore, for example in FIG. 3, since the area of the opposing faces of the FD wiring 111 and the output line (OUT) 109 is larger than the area of opposing faces of the FD wiring 111 and the pixel select line (VDD) 112, the parasitic capacitance C11 between the FD wiring 111 and the output line (OUT) 109 is larger than the parasitic capacitance C12 between the FD wiring 111 and the pixel select line (VDD) 112.

Thus, since the area of opposing faces of adjacent wirings which are formed in the same layer is larger than the area of opposing faces of adjacent wirings which are formed in different layers, the parasitic capacitance between the adjacent wirings in the same layer is dominant. Therefore, providing the output line (OUT) 109 adjacent to the FD wiring 111 suppresses the occurrence of the parasitic capacitance between a wiring other than the output line (OUT) 109 and the FD wiring 111, and improves S/N.

In addition, preferably, the wiring distance between the FD wiring 111 and the output line (OUT) 109 should be minimized as defined by the process limitation (e.g., 100 nm) in order to increase a wiring opening on the photodiode and improve conversion gain at the electric charge storage (FD) 110. When the wiring opening on the photodiode is smaller, an amount of light incident on the photodiode decreases, thus deteriorating S/N.

Figure 10:
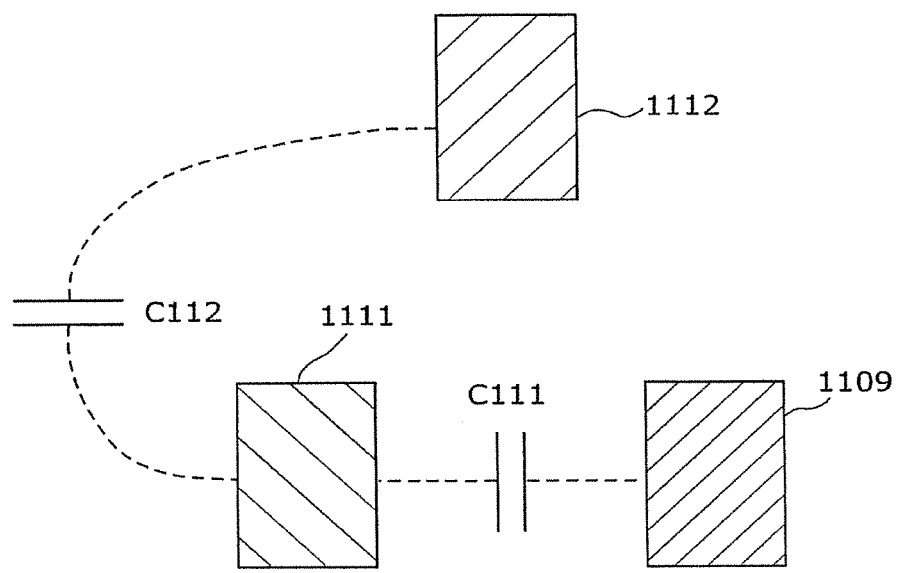
FIG. 10 is a cross-sectional schematic view taken along the line C-C' of the pixel cell shown in FIG. 8.

Moreover, the longer the distance that adjacent wirings face each other, the smaller the parasitic capacitance of the wirings. Therefore, when the wiring distance between the FD wiring 111 and the output line (OUT) 109 increases, the FD wiring 111 has parasitic capacitance with, the pixel select line (VDD) 112, which does not follow the operations of the FD wiring 111. The parasitic capacitance between the FD wiring 111 and the pixel select line (VDD) 112 exists between adjacent surfaces in the height direction in which the area of the FD wiring 111 is larger than that in the width direction. This decreases conversion efficiency at the FD wiring 111, thus deteriorating S/N. Here, the parasitic capacitance is similar to the fringe capacitance C112 shown in FIG. 10 illustrating related art. Here, parasitic capacitance such as the fringe capacitance C112 shown in FIG. 10 is suppressed and the parasitic capacitance C12 occurs as shown in FIG. 3 by providing the pixel select line (VDD) 112 above the FD wiring 111. Since the area of opposing faces of the FD wiring 111 and the pixel select line (VDD) 112 is the area in the width direction of these wirings and is smaller than the area in the height direction, the parasitic capacitance C12 is smaller than C11.

Moreover, since the distance between the FD wiring 111 and the output line (OUT) 109 is shorter than a conventional distance in the present embodiment, the effect of the parasitic capacitance C11 is dominant, further decreasing the effect of the parasitic capacitance C12.

As mentioned above, in the present embodiment, the output line (OUT) 109 which follows the FD potential from the pixel cell 104 is provided side by side with the both sides of the FD wiring 111 so that S/N can be improved by apparently or relatively suppressing the parasitic capacitance of the FD wiring 111 and improving conversion efficiency.

Modification of Embodiment 1

A modification of the first embodiment will be described.

Figure 4:
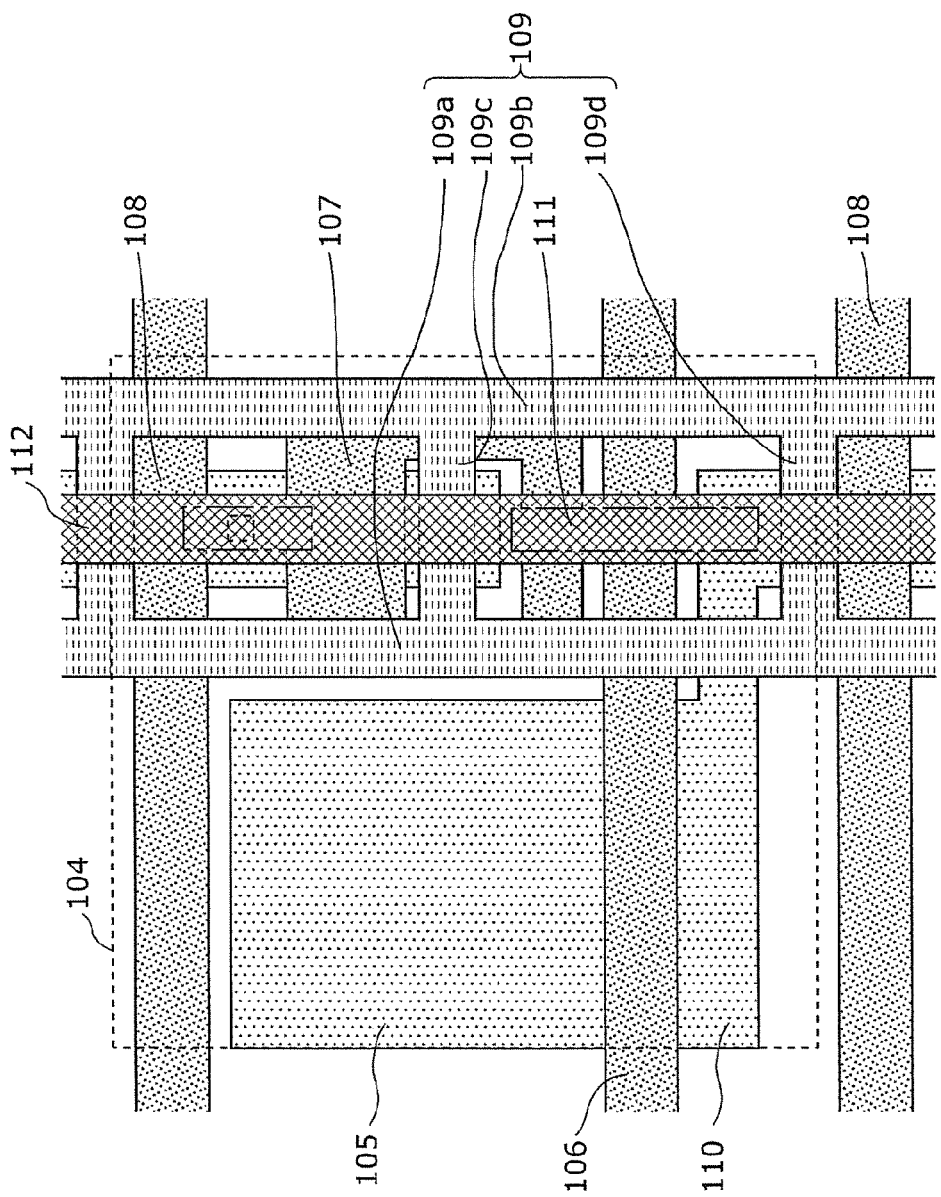
FIG. 4 is a layout view illustrating a configuration of a pixel cell of the solid-state imaging device according to a modification of the first embodiment.

FIG. 4 is a layout view illustrating a configuration of a pixel cell of a solid-state imaging device according to the modification of the first embodiment.

As shown in FIG. 4, in the present modification, the output line (OUT) 109 includes a first wiring 109a and a second wiring 109b that are formed on the separate sides of the FD wiring 111 connected to the electric charge storage (FD) 110 The output line (OUT) 109 further includes the third and fourth wirings 109c and 109d that connect the first and second wirings 109a and 109b. In addition, the four sides of the FD wiring 111 is surrounded by the first, second, third, and fourth wirings 109a, 109b, 109c, and 109d. As shown in FIG. 4, surrounding the FD wiring 111 by the output line (OUT) 109 can further decrease the parasitic capacitance between the FD wiring 111 and another wiring. Moreover, covering the upper part of the drain region of the transfer transistor 106 with the output line (OUT) 109 can decrease the parasitic capacitance between the FD wiring 111 and the output line (OUT) 109.

Here, in order to avoid blocking light incident on the photodiode, it is preferable that the width of the output line (OUT) 109 covering the upper part of the drain region of the transfer transistor 106 be smaller than the total width of the FD wiring 111 and the two output lines (OUT) 109 which have the FD wiring 111 in between.

Embodiment 2

A second embodiment of the present invention will be described.

The difference between the present embodiment and the first embodiment is that another output line connected to the output line (OUT) is further formed between a FD wiring and a pixel select line (VDD).

Figure 5:
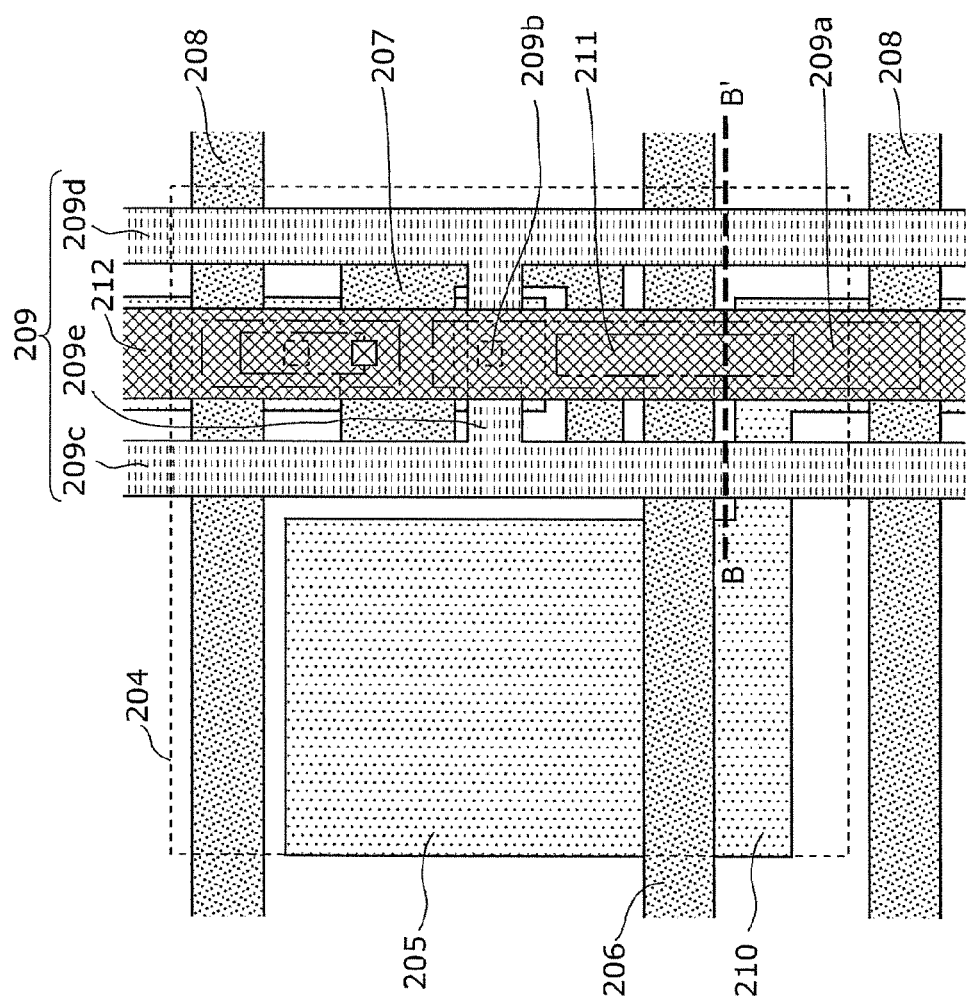
FIG. 5 is a layout view illustrating a configuration of a pixel cell of a solid-state imaging device according to the second embodiment.
Figure 6:
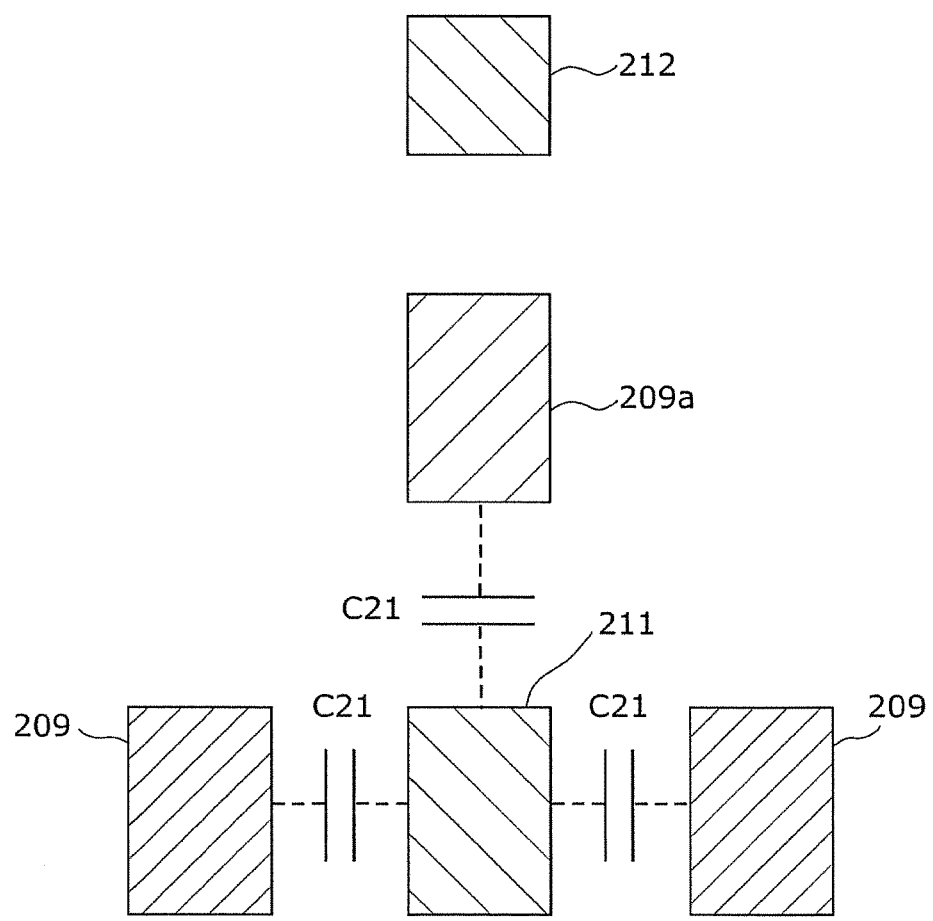
FIG. 6 is a cross-sectional schematic view taken along the line B-B' of the pixel cell shown in FIG. 5.
Figure 7:
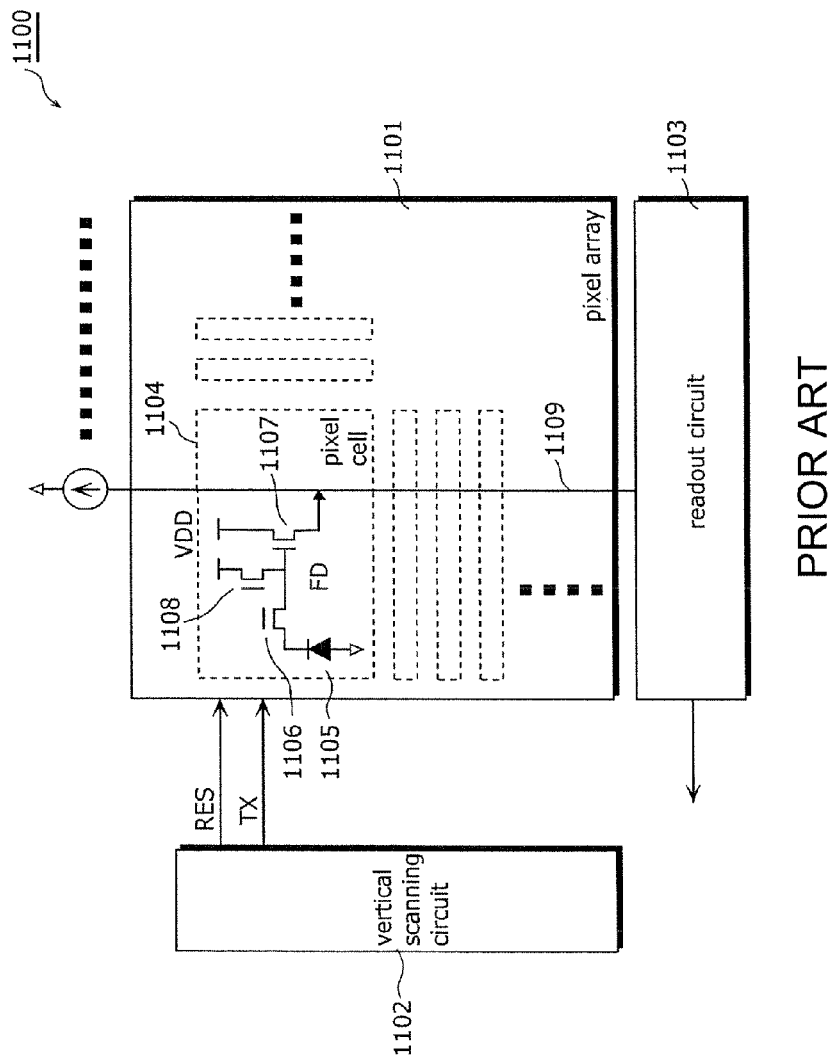
FIG. 7 is a block schematic diagram of a solid-state imaging device according to the related art.
Figure 8:
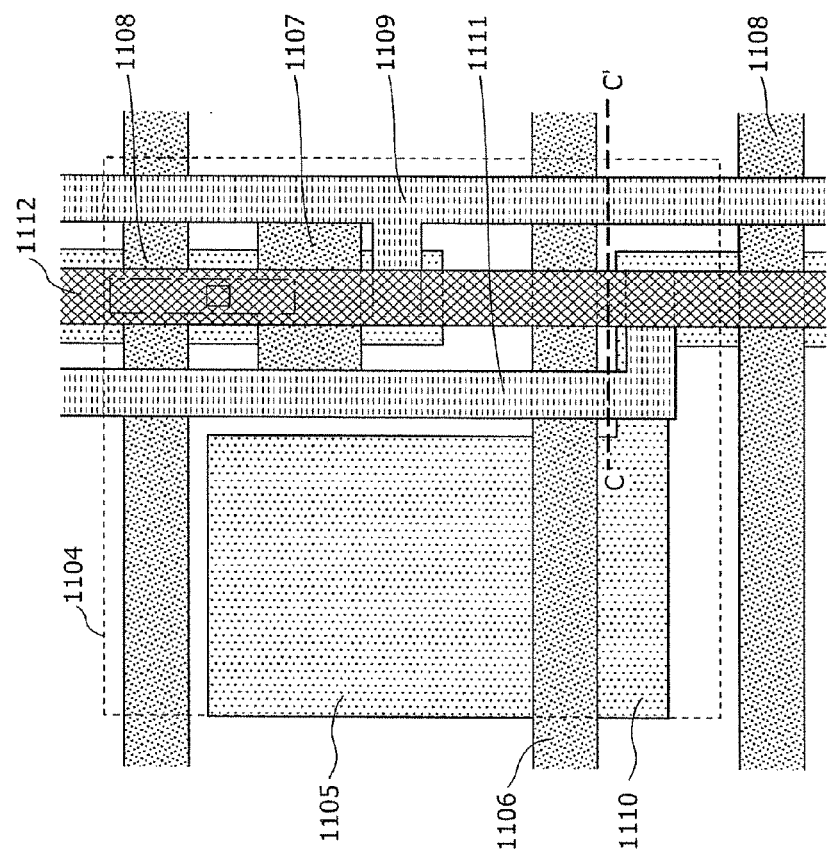
FIG. 8 is a layout view illustrating a configuration of a pixel cell of the solid-state imaging device shown in FIG. 7.
Figure 9:
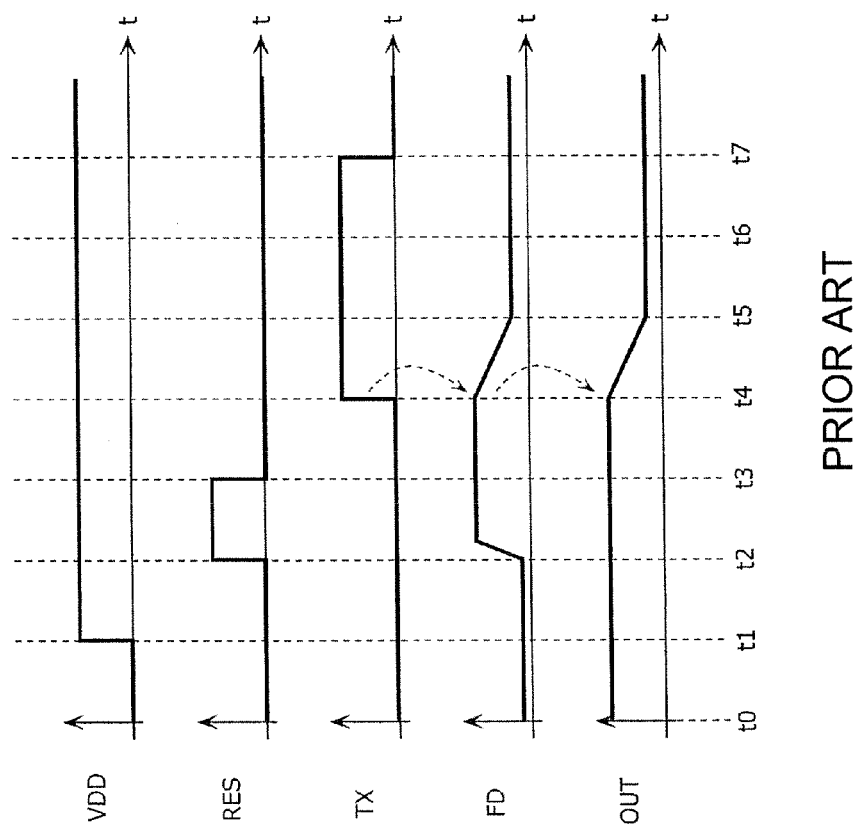
FIG. 9 is a timing chart illustrating the driving operations of the solid-state imaging device shown in FIG. 7.

FIG. 5 is a layout view schematically illustrating a configuration of a pixel cell 204 according to the second embodiment. Moreover, FIG. 6 is a cross-sectional schematic view taken along the line B-B' of the pixel cell 204 in FIG. 5, illustrating the positional relationship between an output line (OUT) 209, a connecting line 209a, a FD wiring 211 connected to an electric charge storage (FD) 210, and a pixel select line (VDD) 212. The pixel cells 204 are arranged in an array to constitute the pixel array shown in FIG. 1 as same as the first embodiment.

As shown in FIG. 5, same as the pixel cells 104 in the first embodiment, the pixel cells 204 each includes a photodiode 205, the electric charge storage (FD) 210 having a floating diffusion wiring (hereinafter referred to as a FD wiring) 211, a transfer transistor 206, an amplifying transistor 207, and a reset transistor 208. The drains of the amplifying transistor 207 and the reset transistor 208 are connected to the pixel select line (VDD) 212.

The electric charge storage (FD) 210, which corresponds to a floating diffusion in the present invention, is connected to the FD wiring 211 and then connected to the gate of the amplifying transistor 207 via the FD wiring 211.

While the pixel select line (VDD) 112 is formed above the FD wiring 111 in the above-mentioned first embodiment, the connecting line 209a connected to the output line (OUT) 209 is formed above the FD wiring 211 and the pixel select line (VDD) 212 is formed above the connecting line 209a in the present embodiment. The connecting line 209a is connected to the output line (OUT) 209 at a contact 209b. Moreover, the output line (OUT) 209 includes a first wiring 209c and a second wiring 209d that are formed on the separate sides of the FD wiring 211 and a third wiring 209e that connects the first wiring 209c and the second wiring 209d. Here, the output line (OUT) 209 and the connecting line 209a correspond to a first output signal line and second output signal line in the present invention, respectively.

It should be noted that although insulating layers are omitted in FIG. 6, the insulating layers are formed between wirings, such as the output line (OUT) 209, the FD wiring 211 connected to the electric charge storage (FD) 210, and the pixel select line (VDD) 212. Moreover, the insulating layers may be composed of more than three layers.

In this configuration, since the connecting line 209a connected to the output line (OUT) 209 that has an electric potential which varies with changes in the electric potential of the output line (OUT) 209 is also formed above the FD wiring 211, the parasitic capacitance between the FD wiring 211 and the output line (OUT) 209 relatively decreases. Since this can increase signal amplitude at the electric charge storage (FD) 210, signal amplitude is less likely to be affected by noise and thus S/N can be improved.

As mentioned above, in the present embodiment, the output line (OUT) 209 which follows the FD potential from a pixel cell is provided side by side with the both sides of the FD wiring 211 connected to the electric charge storage (FD) 210, and the connecting line 209a is provided above the FD wiring 211. This apparently suppresses the parasitic capacitance of the electric charge storage (FD) 210 and improves conversion efficiency, thus allowing S/N to be improved.

It should be noted that measurements of the wirings such as width, height, and distance are the same as the first embodiment.

Moreover, in the present embodiment, the FD wiring 211 can be shorter than a conventional wiring and the parasitic capacitance C21 between the FD wiring 211 and the pixel select line (VDD) 212 provided above the FD wiring 211 can be decreased.

It should be noted that the output wiring (OUT) 209 provided side by side with the FD wiring 211 connected to the electric charge storage (FD) 210 may surround the four sides of the FD wiring 211. In this case, surrounding the FD wiring 211 by the output wiring (OUT) 209 can decrease the parasitic capacitance between the FD wiring 211 and another wiring. In addition, covering the upper part of the drain region of the transfer transistor 206 can further decrease the parasitic capacitance between the FD wiring 211 and the output line (OUT) 209.

Here, in order to avoid blocking light incident on the photodiode, it is preferable that the width of the output line (OUT) 209 covering the upper part of the drain region of the transfer transistor 206 be smaller than the total width of the FD wiring 211 and the two output lines (OUT) 209 which have the FD wiring 211 in between.

It should be noted that the present invention is not limited to the above-mentioned embodiments and various improvements and modifications may be made without departing from the scope of the present invention.

For instance, although a one-pixel one-cell structure having one photodiode per one pixel cell is applied to the above embodiments as an example, the present invention is not limited to this structure. For instance, a two-pixel one-cell structure having two photodiodes and two transistors per one pixel cell can be also used. Moreover, an n-pixel one-cell structure having more photodiodes per one cell can be also used.

Moreover, although multiple pixel cells are provided in an array in the above embodiments, the present invention is not limited to this arrangement. For instance, pixel cells may be arranged in a shape of honeycomb.

Moreover, on the assumption that the chip surface receives light, a structure in which the wiring of a photodiode has an opening (front side illumination image sensor) is applied to the above embodiments as an example. However, the present invention is not limited to this structure. The present invention is applicable to a backside illumination image sensor that receives light from the backside of a chip.

Moreover, the semiconductor substrates in the above embodiments may be n-type or p-type. For instance, the drain and source of a transistor may be connected inversely.

Although only some exemplary embodiments of the present invention have been described in detail above, a solid-state imaging device according to the present invention is intended to include other embodiments which are achieved by combining optional structural elements in the above embodiments, modifications obtained by making various modifications which those skilled in the art would conceive to the embodiments without materially departing from the scope of the present invention, and various devices including the solid-state imaging devices according to the present invention. For example, the present invention includes a movie camera including a solid-state imaging device according to the present invention.

INDUSTRIAL APPLICABILITY

The present invention is useful to make a solid-state imaging device for which high S/N images are required to be captured as an imaging device such as a digital still camera.

The invention claimed is:

1. A solid-state imaging device comprising:
a photodiode that is formed in a semiconductor substrate and stores electric charges according to an amount of light received;
a transfer transistor that reads out the electric charges from the photodiode;
a floating diffusion to which the electric charges read out by the transfer transistor is transferred;
a floating diffusion wiring connected to the floating diffusion;
an amplifying transistor having a gate connected to the floating diffusion wiring;
a power line connected to one of a drain and a source of the amplifying transistor; and
a first output signal line connected to the other of the drain and the source of the amplifying transistor,
wherein the first output signal line includes a first wiring, a second wiring, and a third wiring in a layer having the floating diffusion wiring formed on the semiconductor substrate, the first wiring and the second wiring being formed on the separate sides of the floating diffusion wiring, and the third wiring connecting the first wiring and the second wiring, and
the power line is formed above the floating diffusion wiring.

2. The solid-state imaging device according to claim 1, wherein the first output signal line further includes a fourth wiring that connects the first wiring and the second wiring, and
the floating diffusion wiring is surrounded by the first wiring, the second wiring, the third wiring, and the fourth wiring.

3. The solid-state imaging device according to claim 1, wherein the first output signal line is connected to a second output signal line formed between the floating diffusion wiring and the power line.

4. The solid-state imaging device according to claim 1, wherein the floating diffusion wiring is longer in height than in width.

5. The solid-state imaging device according to claim 1, wherein a distance between the floating diffusion wiring and the first output signal line is longer than a distance between the floating diffusion wiring and the power line.

* * * * *